United States Patent
Condrashoff et al.

(10) Patent No.: US 6,709,522 B1
(45) Date of Patent: Mar. 23, 2004

(54) MATERIAL HANDLING SYSTEM AND METHODS FOR A MULTICHAMBER PLASMA TREATMENT SYSTEM

(75) Inventors: Robert Sergel Condrashoff, Walnut Creek, CA (US); James Patrick Fazio, Concord, CA (US); David Eugene Hoffman, Pittsburg, CA (US); James Scott Tyler, Galt, CA (US)

(73) Assignee: Nordson Corporation, Westlake, OH (US)

( * ) Notice: Subject to any disclaimer, the term of this patent is extended or adjusted under 35 U.S.C. 154(b) by 33 days.

(21) Appl. No.: 09/702,416

(22) Filed: Oct. 31, 2000

Related U.S. Application Data
(60) Provisional application No. 60/217,525, filed on Jul. 11, 2000.

(51) Int. Cl.[7] .......................... C23C 16/458; C23F 1/12; H01L 21/306
(52) U.S. Cl. ............. 118/719; 156/345.31; 156/345.24; 156/345.32; 118/723 R; 118/715
(58) Field of Search .................... 118/719, 723 R, 118/715, 300, 695, 723 E, 733; 156/345.31, 345.32, 345.24, 345; 414/217, 217.1, 744.1, 744.3, 744.5, 805, 221, 810; 318/45, 568.11, 690; 134/18, 19; 438/240, 455, 581, 584, 637, 679, 680, 688, 729, 758, 800

(56) References Cited

U.S. PATENT DOCUMENTS

| | | | |
|---|---|---|---|
| 3,294,670 A | 12/1966 | Charschan et al. | ......... 204/298 |
| 3,641,973 A | 2/1972 | Shrader | ......... 118/49 |
| 4,208,159 A | 6/1980 | Uehara et al. | ......... 414/225 |
| 4,252,595 A | 2/1981 | Yamamoto et al. | ......... 156/345 |
| 4,278,528 A | 7/1981 | Kuehnle et al. | ......... 204/298 |
| 4,318,767 A | 3/1982 | Hijikata et al. | ......... 156/345 |
| 4,336,438 A | 6/1982 | Uehara et al. | ........ 219/121 PG |

(List continued on next page.)

FOREIGN PATENT DOCUMENTS

| | | | |
|---|---|---|---|
| DE | 3935002 | 4/1991 | |
| JP | 58-048935 | * 3/1983 | ............ H01L/21/68 |
| JP | 58-060553 | * 11/1983 | ........... H01L/21/68 |
| JP | 59-164696 | 9/1984 | |
| JP | 03-023137 | 1/1991 | |
| JP | 03-159143 | 7/1991 | |
| JP | 04-123430 | 4/1992 | |
| JP | 04-311044 | 11/1992 | |
| JP | 05-074739 | * 3/1993 | ......... H01L/21/302 |
| JP | 6-21032 | 1/1994 | |
| JP | 09-129581 | 5/1997 | |
| JP | 2828066 | 11/1998 | |

OTHER PUBLICATIONS

Panasonic Factory Automation Company, *Plasma Cleaning Systems*, Brochure, Nov. 2000.

(List continued on next page.)

*Primary Examiner*—Jeffire Lund
*Assistant Examiner*—Rudy Zervigon
(74) *Attorney, Agent, or Firm*—Wood, Herron & Evans, L.L.P.

(57) ABSTRACT

A plasma treatment system wherein workpieces are carried in slots in a magazine. The plasma treatment system has first and second plasma treatment chambers mounted on a common base a base. A queuing station is located on the base for receiving the magazines. A magazine handler moves a magazine to a location adjacent one of the first and second plasma treatment chambers. A workpiece handler transfers a workpiece between the magazine and the one of the first and second plasma treatment chambers. The workpiece handler has a workpiece translator with a first surface that contacts a first edge of the workpiece for pushing the workpiece into the plasma treatment chamber. In addition, the workpiece translator has a second surface that contacts an opposite edge of the workpiece for pushing the workpiece out of the plasma treatment chamber. There are various methods relating to the use of multiple plasma treatment chambers on a single base and the automatic handling of workpieces for loading and unloading the multiple plasma treatment chambers.

17 Claims, 10 Drawing Sheets

U.S. PATENT DOCUMENTS

| | | | | |
|---|---|---|---|---|
| 4,405,435 A | * | 9/1983 | Tateishi et al. | 204/298.25 |
| 4,418,639 A | | 12/1983 | Wills et al. | 118/50 |
| 4,550,239 A | | 10/1985 | Uehara et al. | 219/121 PG |
| 4,550,242 A | | 10/1985 | Uehara et al. | 156/345 |
| 4,575,299 A | | 3/1986 | Layton | 414/222 |
| 4,584,045 A | | 4/1986 | Richards | 156/345 |
| 4,637,853 A | | 1/1987 | Bumble et al. | 156/345 |
| 4,705,444 A | | 11/1987 | Tullis et al. | 118/729 X |
| 4,770,121 A | | 9/1988 | Ebata et al. | 118/686 |
| 4,802,809 A | * | 2/1989 | Bonora et al. | 414/217.1 |
| 4,816,116 A | | 3/1989 | Davis | 156/643 |
| 4,816,638 A | | 3/1989 | Ukai et al. | 219/121.43 |
| 4,840,702 A | | 6/1989 | Schumacher, III | 156/643 |
| 4,889,609 A | | 12/1989 | Cannella | 204/298 |
| 5,030,056 A | | 7/1991 | Kitayama et al. | 414/749 |
| 5,044,871 A | | 9/1991 | Davis et al. | 414/786 |
| 5,048,164 A | * | 9/1991 | Harima | 29/25.01 |
| 5,064,337 A | * | 11/1991 | Asakawa et al. | 414/639 |
| 5,079,031 A | | 1/1992 | Yamazaki et al. | 118/729 X |
| 5,086,729 A | | 2/1992 | Katagiri | 118/729 |
| 5,116,640 A | | 5/1992 | Mikami et al. | 118/719 X |
| 5,181,819 A | * | 1/1993 | Sakata et al. | 414/217 |
| 5,216,223 A | | 6/1993 | Straemke | 219/121.43 |
| 5,239,182 A | * | 8/1993 | Tateyama et al. | 250/559.37 |
| 5,259,942 A | | 11/1993 | Kempf | 204/298.25 |
| 5,286,296 A | | 2/1994 | Sato | 118/719 |
| 5,288,684 A | | 2/1994 | Yamazaki et al. | 118/723 E X |
| 5,292,393 A | * | 3/1994 | Maydan et al. | 156/345 |
| 5,302,077 A | | 4/1994 | Sato | 414/609 |
| 5,303,671 A | | 4/1994 | Kondo et al. | 118/719 |
| 5,310,410 A | | 5/1994 | Begin | 29/25.01 |
| 5,314,298 A | | 5/1994 | Kim | 414/797.9 |
| 5,319,216 A | * | 6/1994 | Mokuo et al. | 250/559.4 |
| 5,345,056 A | | 9/1994 | Frei et al. | 219/121.59 |
| 5,374,147 A | * | 12/1994 | Hiroki et al. | 414/217 |
| 5,387,265 A | | 2/1995 | Kakizaki et al. | 118/730 X |
| 5,401,356 A | * | 3/1995 | Enami et al. | 438/5 |
| 5,433,371 A | | 7/1995 | Morisako | 228/180.5 |
| 5,455,082 A | * | 10/1995 | Saito et al. | 427/542 |
| 5,468,112 A | * | 11/1995 | Ishii et al. | 414/416.03 |
| 5,480,052 A | | 1/1996 | Furr et al. | 216/71 |
| 5,492,265 A | | 2/1996 | Wandke | 228/215 |
| 5,515,986 A | | 5/1996 | Turlot et al. | 156/345 X |
| 5,542,559 A | | 8/1996 | Kawakami et al. | 216/67 |
| 5,573,597 A | | 11/1996 | Lantsman | 118/723 MP |
| 5,576,629 A | | 11/1996 | Turner et al. | 324/709 |
| 5,587,205 A | | 12/1996 | Saito et al. | 427/553 |
| 5,609,290 A | | 3/1997 | Bobbio et al. | 228/206 |
| 5,613,821 A | * | 3/1997 | Muka et al. | 414/217.1 |
| 5,634,765 A | | 6/1997 | Miyoshi | 414/786 |
| 5,647,942 A | | 7/1997 | Haji | 156/281 |
| 5,685,684 A | * | 11/1997 | Kato et al. | 414/217 |
| 5,700,127 A | * | 12/1997 | Harada et al. | 414/416.08 |
| 5,707,485 A | | 1/1998 | Rolfson et al. | 156/643.1 |
| 5,767,008 A | | 6/1998 | Haji | 438/612 |
| 5,779,807 A | | 7/1998 | Dornfest et al. | 134/1.2 |
| 5,788,447 A | * | 8/1998 | Yonemitsu et al. | 414/217 |
| 5,789,878 A | * | 8/1998 | Kroeker et al. | 318/45 |
| 5,823,416 A | | 10/1998 | Haji | 228/4.5 |
| 5,900,064 A | | 5/1999 | Kholodenko | 118/723 R |
| 5,947,675 A | * | 9/1999 | Matsushima | 414/416.08 |
| 5,958,510 A | | 9/1999 | Sivaramakrishnam et al. | 427/255.6 |
| 5,972,163 A | | 10/1999 | Haji | 156/345 |
| 5,989,346 A | * | 11/1999 | Hiroki | 118/719 |
| 5,993,678 A | | 11/1999 | Ohkawa | 216/68 |
| 6,001,267 A | | 12/1999 | Os et al. | 216/67 |
| 6,010,636 A | | 1/2000 | Donohue et al. | 216/71 |
| 6,053,980 A | * | 4/2000 | Suda et al. | 118/719 |
| 6,061,561 A | * | 5/2000 | Alanara et al. | 455/422 |
| 6,066,210 A | * | 5/2000 | Yonemitsu et al. | 118/719 |
| 6,068,784 A | | 5/2000 | Collins et al. | 216/68 |
| 6,093,904 A | | 7/2000 | Haji | 219/121.45 |
| 6,143,083 A | * | 11/2000 | Yonemitsu et al. | 118/719 |
| 6,267,549 B1 | * | 7/2001 | Brown et al. | 414/744.5 |
| 6,331,347 B2 | | 12/2001 | Haji | 428/209 |
| 6,340,405 B2 | * | 1/2002 | Park | 156/345 |

OTHER PUBLICATIONS

Panasonic Factory Automation Company, Japanese Brochure, Nov. 2000.

March Instruments. Inc., *In–Line Plasma System*, Brochure, Aug. 1995.

March Instruments, Inc., *TAC Technology Advancement Center*. Brochure. Feb. 1995.

Materials Research Corporation, *1.12 Inline production magnetron sputtering*, Journal Article, 3 pages.

Von Dr.–Ing M. Nowottnick, Fraunhofer–Einrichtung fur Zuverlassigkeit und Mikrointegration (IZM), Berlin, *Plasmabehandlung als umweltfreundliche Alternative in der Leiterplattenfertigung*, Galvanotechnik D–88348 Saulgau 86 (1995) Nr. 4; Journal Article, 6 pages.

Abstract of Japanese Patent Application No. 02167161 (JP90167161), filed Jun. 1990.

Abstract of Japanese Patent No. JP6021032, published Jan. 1994.

Abstract of Japanese Patent No. JP9129581, published May 1997.

Abstract of Japanese Patent Application No. 03207407 (JP91207407), filed Jul. 1991.

C. Whitman et al, "Ultralarge scale integrated metallization and interconnects", J.Vac.Sci.Tech. A 17(4), Jul./Aug. 1999, pp. 1893–1897.*

Hosokawa et al, "Real–time substrate misalignment monitor and automatic recalibration", J.Vac.Sci.Tech. A 16(3), May/Jun. 1998, pp. 1921–1925.*

* cited by examiner

MATERIAL HANDLING SYSTEM AND METHODS FOR A MULTICHAMBER PLASMA TREATMENT SYSTEM

This application claims the benefit of U.S. Provisional Application No. 60/217,525, filed Jul. 11, 2000.

FIELD OF THE INVENTION

This invention relates to plasma treatment systems and more particularly, to methods and apparatus relating to a multichamber plasma treatment system.

BACKGROUND OF THE INVENTION

The manufacture and packaging of electronic components or workpieces such as semiconductors and flat panel displays often takes place within a series of individual processing stations that are designed to perform a specific type of processing operation such as a deposition, an etching, a thermal processing, or a cleaning. Processing systems have been designed in which multiple processing stations are arranged sequentially to form an in-line tool or are positioned in a cluster to form a cluster tool. Plasma treatment chambers are incorporated into processing stations for exposing workpieces to a plasma in preparation for another operation in a successive processing station. A plasma treatment process is used to etch clean or otherwise process or treat a surface of the workpiece. Workpieces are often transferred to and from the plasma treatment chamber via a conveyor, robot or manually; and other workpiece handling devices are used to shuttle the workpieces into and out of a plasma treatment chamber.

While such plasma treatment systems have worked reasonably well in the past, the structure of such systems imposes certain limitations on their operation that limit system efficiency and throughput. One limitation is that only a single plasma treatment chamber is incorporated onto a single machine or base unit. Such a plasma treatment chamber and machine combination has a fixed footprint that consumes a fixed amount of manufacturing floor space. Thus, one disadvantage is that every time additional plasma treatment chambers are added to improve quality or increase throughput, additional manufacturing floor space is required in direct proportion to the number of plasma treatment chambers added. The cost of additional floor space is substantial and may require the construction of an additional structure or building. Another disadvantage arising from limiting a single plasma treatment chamber to a single base or machine is that any savings that may available through the sharing of electric and gas utilities is precluded.

Another limitation in the structure of conventional plasma treatment systems is the limited capabilities of the workpiece handling systems that are currently available. Such workpiece handling systems are relatively bulky and large and make the handling of workpieces, either individually or in bulk, within a small volume extremely difficult.

Therefore, there is a need to substantially improve the number of plasma treatment chambers that are located within a facility utilizing plasma treatment processing. There is a further need to improve the throughput of each machine base or footprint of a plasma treatment system. There is a still further need to provide material handling devices that are more compact and have the ability to handle workpieces, both in bulk and individually, more quickly and efficiently.

SUMMARY OF THE INVENTION

The plasma treatment system of the present invention permits the use of multiple plasma treatment chambers on a single machine base. The plasma treatment system of the present invention has a compact footprint that conserves manufacturing floor space, thereby substantially increasing the throughput capability of the utilized floor space and providing a substantial savings in manufacturing costs. Further, each of the multiple plasma treatment chambers on a single base is independently controllable, so that the chambers may be used in a manner deemed most efficient and economical by the user. In addition, the present invention provides improved material handling devices for handling the workpieces both individually and in bulk. Such material handling devices substantially reduce the cycle time of loading and unloading workpieces from the plasma treatment chambers, thereby providing substantial additional cost benefits. Thus, the plasma treatment system of the present invention provides a more reliable, efficient and cost effective plasma treatment process than was previously available.

In accordance with the principles of the present invention and the described embodiments, the present invention provides a plasma treatment system for plasma treating workpieces being carried in slots in a magazine. The plasma treatment system has a base and first and second plasma treatment chambers mounted on the base. A magazine handler moves a magazine to a location adjacent one of the first and second plasma treatment chambers. A workpiece handler transfers a workpiece between the magazine and the one of the plasma treatment chambers.

In another embodiment of the invention, a plurality of workpieces are carried in slots within a magazine for processing within a processing space within a plasma treatment chamber of a plasma treatment system. The plasma treatment system includes a magazine handler for positioning the magazine on a magazine indexer. The magazine indexer is capable of positioning the magazine to a plurality of vertical positions corresponding to vertical positions of the slots. A workpiece translator has a first surface for contacting a first edge of the workpiece in order to move the workpiece with the first surface from a first position outside the plasma treatment chamber to the processing space within the plasma treatment chamber. The workpiece translator further has a second surface for contacting an opposite edge of the workpiece in order to move the workpiece with the second surface from the processing space within the plasma treatment chamber to the first position outside the plasma treatment chamber.

In one aspect of the invention, the plasma treatment system further includes a kicker having an end effector positioned and configured to eject a workpiece from the magazine. In addition, a pinch wheel assembly is positioned and configured to move the workpiece from the magazine to the first position.

In a further embodiment of the invention, a method is provided for handling workpieces to be treated in a plasma treatment system. First, a magazine carrying untreated workpieces in slots is moved from a queuing station to a location adjacent a first of two plasma treatment chambers mounted on a common base. Prior to a plasma treatment process, an untreated workpiece is automatically transferred from a slot in the magazine to a processing space within the first of two plasma treatment chambers. Then after the plasma treatment process, a treated workpiece is automatically transferred from the processing space within the first of two plasma treatment chambers to the slot in the magazine. The above transferring steps are repeated for all of the untreated workpieces in the magazine, and the magazine carrying treated workpieces is automatically moved from the location adjacent the first of two plasma chambers to the queuing station.

In another embodiment of this invention, prior to a plasma treatment process, a workpiece is automatically moved into the plasma treatment chamber by pushing on one edge of the workpiece. Thereafter, after the plasma treatment process, the workpiece is automatically moved out of the plasma treatment chamber by pushing on an opposite edge of the workpiece.

These and other objects and advantages of the present invention will become more readily apparent during the following detailed description taken in conjunction with the drawings herein.

DETAILED DESCRIPTION OF THE INVENTION

Figure 1:
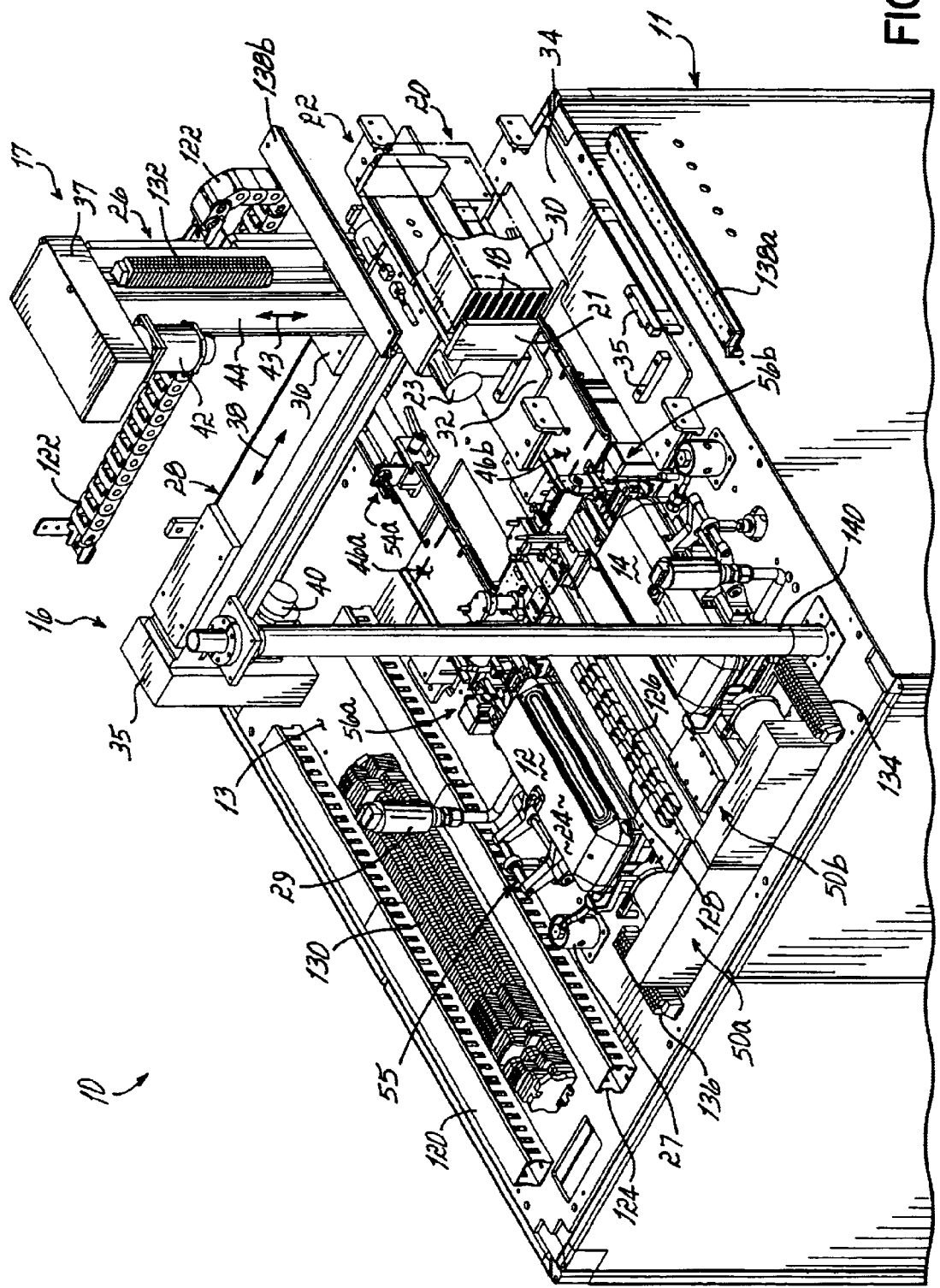
FIG. 1 is a perspective view of the plasma treatment system.
Figure 2:
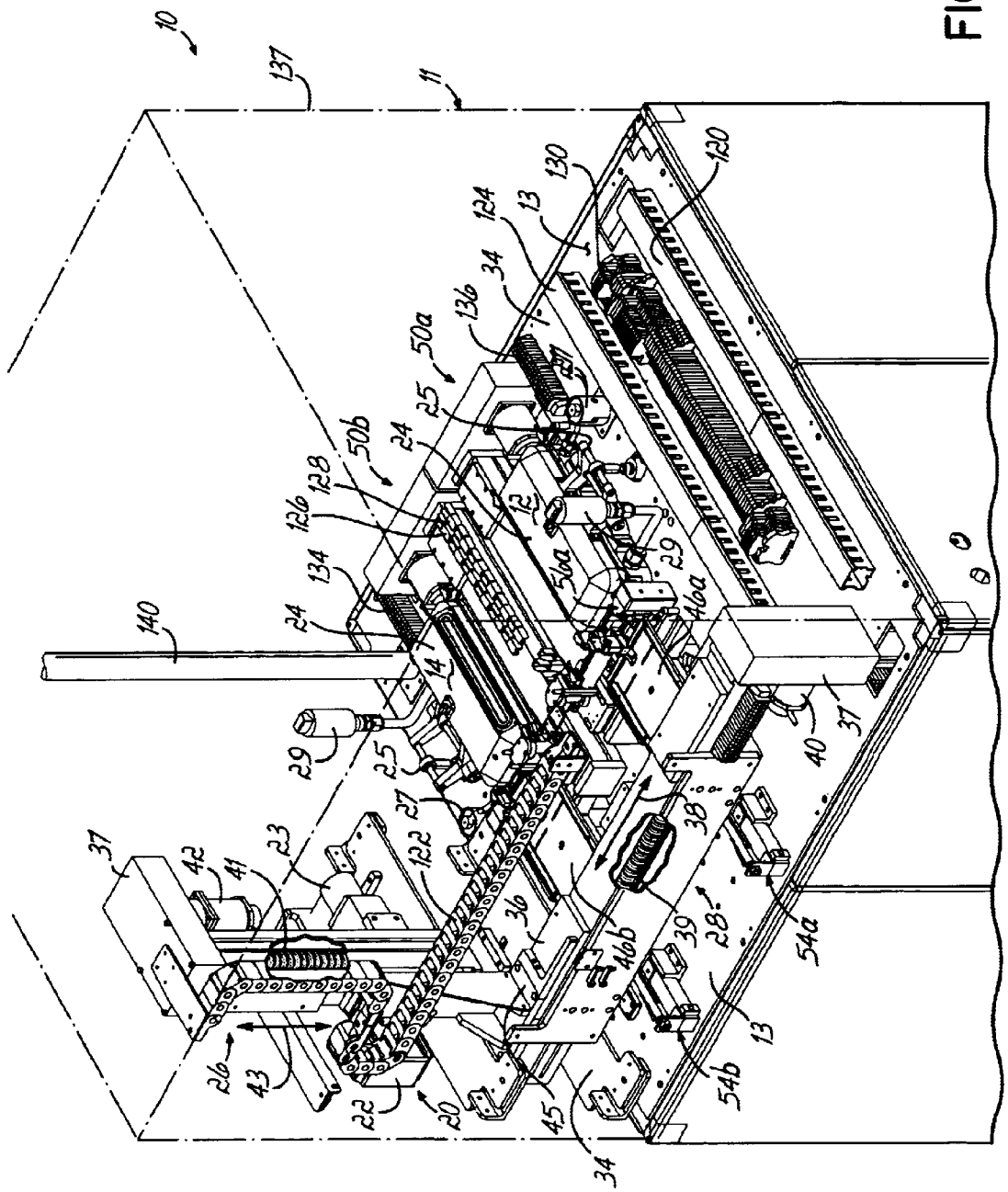
FIG. 2 is another perspective view of the plasma treatment system.

Referring to FIGS. 1 and 2, a processing station comprises a plasma treatment system 10 that includes a pair of high-speed symmetrical plasma treatment chambers 12 and 14 and a material handling system, indicated generally at 16. Plasma treatment system 10 is housed in a single base or cabinet 11. Material handling system 16 includes a magazine handler 17 for handling a magazine 30 filled with workpieces 18 and a pair of workpiece handlers, indicated generally at 50a and 50b, for handling individual workpieces 18. A magazine 30 is placed on a queuing station, for example, an upper shelf 32 or a lower shelf 34, either manually or by a robotic system (not shown) that transfers magazines 30 between processing stations. Magazine 30 holds a plurality of generally horizontal strips or workpieces 18 in a vertical array of open-ended slots 19 having a predetermined separation or pitch between adjacent slots 19. A typical magazine 30 holds between twenty to forty individual workpieces 18.

Workpieces 18 may be substrates for packaging semiconductor devices, such as ball grid arrays, flip chip packaging, lead frames, wired bonded packages, or other boards. However, the present invention need not be limited strictly to semiconductor packaging substrates and can be readily adapted to processing other substrates, including semiconductor wafers and flat panel displays. In addition, the present invention can accommodate workpieces such as boats or cassettes holding a plurality of devices or packages.

The magazine handler 17 moves to a position adjacent the magazine 30, and a gripper 20 grasps the magazine. The magazine handler 17 then places the magazine 30 adjacent one of the workpiece handlers 50a, 50b such that one of the slots 19 is accessible to a workpiece handler 50. Magazines 30 placed on the upper shelf 32 are processed in plasma chamber 12, and magazines placed on the lower shelf 34 are processed by the plasma chamber 14. Each of the workpiece handlers 50a, 50b functions to move an untreated workpiece 18 from a magazine 30 into an appropriate one of the plasma treatment chambers 12, 14 for plasma treatment processing. After the treatment is complete, the appropriate one of the workpiece handlers 50a, 50b removes the treated workpiece 18 from the associated one of the plasma treatment chambers 12, 14 and loads the treated workpiece 18 into a magazine 30. The magazine handler 17 then increments the vertical position of the magazine 30, thereby making another slot 19 accessible to the appropriate one of the workpiece handlers 50a, 50b. After all of the workpieces 18 in a magazine have been processed, the magazine handler 17 then moves the magazine 30 back to the appropriate one of the shelves 32, 34.

The plasma treatment chambers 12, 14 energize atoms of a process gas at a sub-atmospheric pressure to generate a plasma which is used to modify or treat the surface properties of the workpieces 18. Plasma treatment chambers 12, 14 operate to treat the workpieces 18 according to user determined plasma treatment schedules or recipes. Plasma treatment chambers 12, 14 are controlled by identical respective, but independently operating, controllers; and therefore, chambers 12, 14 can process workpieces 18 of diverse size and/or type in accordance with different recipes. By way of specific example but not limitation, a plasma treatment chamber for use with the present invention is disclosed in P.C.T. Application Serial No. US00/18797 in the name of James Tyler entitled "High-speed Symmetrical Plasma Etching Device", filed on Jul. 10, 2000 which application is hereby incorporated by reference herein in its entirety.

With reference to plasma treatment chamber 12, chamber 12 includes a chamber lid 24 that is pivotably opened and closed by a pneumatically-actuated hinge assembly 25, a bleed valve 27 for venting the interior of chamber 12 to atmospheric pressure, and a pressure gauge 29 for monitoring the pressure within the interior of chamber 12. Chamber 12 has associated internal and external structures (not shown), such as a radio frequency generator and a vacuum pump, used to initiate and sustain a plasma within the interior of chamber 12 from a sub-atmospheric pressure of a process gas, as will be understood by those of ordinary skill in the art of plasma processing. The interior of chamber 12 further includes structure for holding workpieces 18 provide by the workpiece handler 50a in a relationship that permits plasma processing, as will be understood by those of ordinary skill in the art of plasma processing. Since chambers 12, 14 are identical in construction, only chamber 12 is described with any detail herein.

Magazine handler 17 includes a vertical magazine translator 26, a horizontal magazine translator 28, and a pair of magazine indexers 46a and 46b. The horizontal magazine translator 28 has an actuator 40, for example, a bidirectional electric motor, connected in a known manner to a drive mechanism 35, for example, with a belt drive, to a horizontal screw 39 rotationally supported at its ends above a surface 13. Rotation of the horizontal screw 39 by the motor 40 moves a nut (not shown) in a horizontal direction 38 parallel to the surface 13. A carriage 36 is mechanically connected to, and carried by, the nut of the horizontal screw 39. The carriage 36 is connected to and carries a support block 45 of a vertical magazine translator 26. The vertical magazine translator 26 has an actuator 42, for example, a bidirectional electric motor, connected in a known manner to a drive mechanism 37, for example, with a belt drive, to a vertical screw 41 rotationally supported by its nut (not shown). The gripper 20 is connected to the vertical screw 41, and the nut of the vertical screw 41 is connected to the support block 45. Thus, rotation of the vertical screw 41 by the motor 40 moves the vertical screw 41 and the gripper 20 in a vertical direction 43 perpendicular to the surface 13. Further, the connection of the of the vertical screw 41 to the support block 45 and carriage 36 causes the carriage 36 to carry the vertical magazine translator 26 in the horizontal direction 38 in response to the operation of the motor 40.

Gripper 20 has an actuator 23, for example, a pneumatic gripper cylinder, that actuates a pair of opposed gripper jaws 21, 22 for grasping opposed sides of a magazine 30 in a pinching movement. An exemplary cylinder 23 is a linear pneumatic cylinder having a spring which biases the gripper jaws 21, 22 toward a closed position. Pressurized air from a pneumatic source 354 (FIG. 8) for example, shop air, is routed through a 4-way solenoid valve 352 (FIG. 8) in a known manner to apply a pressure in a first direction to complement, that is, add to, the biasing force of the spring. Operating in that mode, the cylinder 23 facilitates the closing of the gripper jaws 21, 22 on a magazine 30 positioned on one of the shelves 32 or 34. Alternatively, the operation of the solenoid 352 is switched to reverse the operation of the cylinder 23, so that the cylinder operates in opposition to the spring force, thereby opening the jaws 21,22 of the gripper 20 and releasing the magazine 30. It will be appreciated that magazine handler 17 may utilize alternative mechanisms to grasp magazine 30 without departing from the spirit and scope of the present invention.

Figure 4:
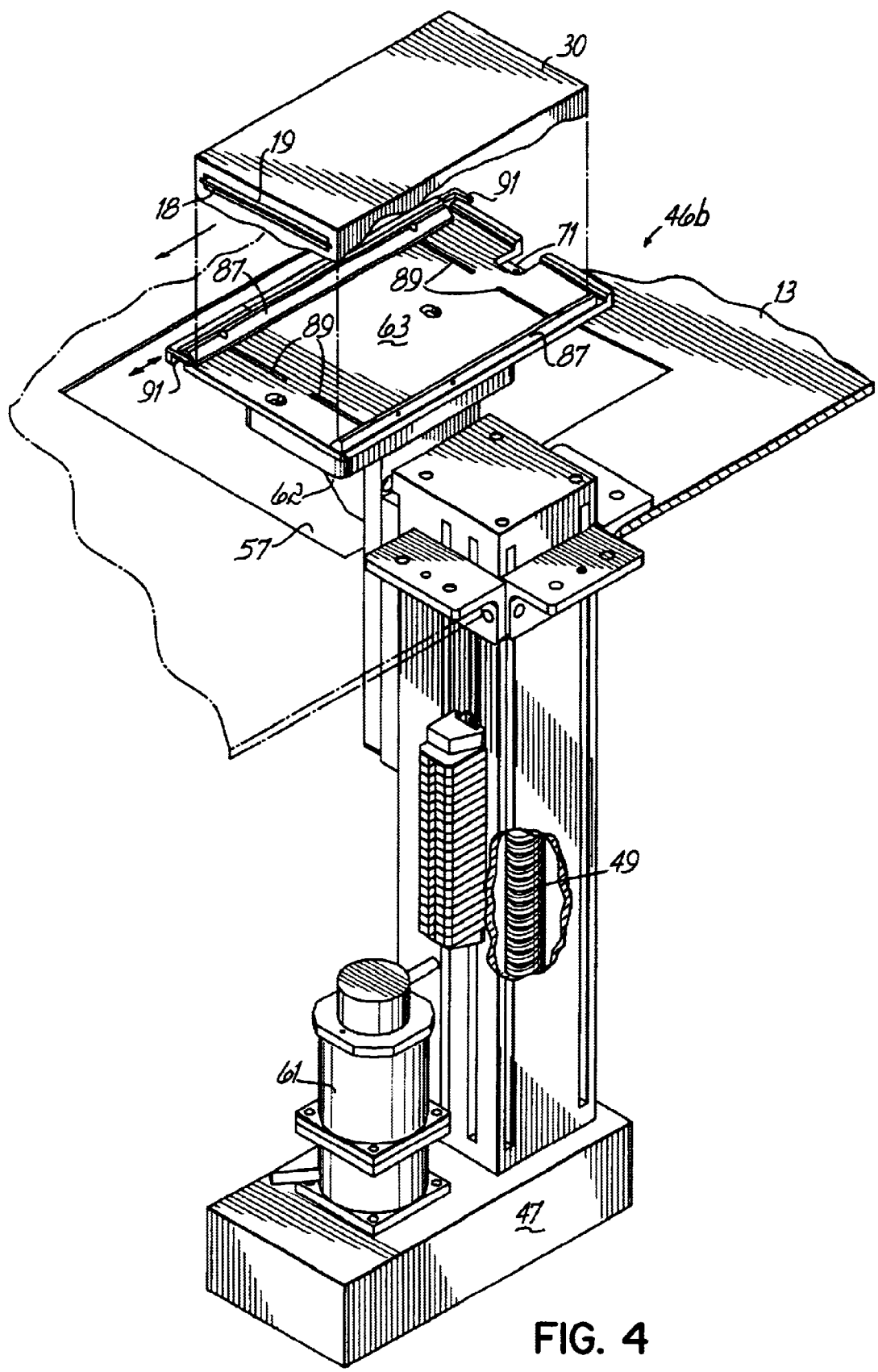
FIG. 4 is a perspective view of the vertical magazine indexer, taken along line 4—4 of FIG. 3.

The magazine handler 17 further includes magazine indexers 46a, 46b which are identical in construction: and therefore, only magazine indexer 46b will be described in detail. Referring to FIG. 4, magazine indexer 46b has an indexing actuator 61, for example, a bidirectional electric motor, connected in a known manner to a drive mechanism 47, for example, with a belt drive, to a lift screw 49 rotationally supported at its ends in a vertical direction below the surface 13. A lift screw nut (not shown) is connected to a bracket 62 that supports a table 63 within an opening 57 of the surface 13 Rotation of the lift screw 49 by the motor 61 moves the bracket 62 and table 63 in the vertical direction perpendicular to the surface 13. Thus, the magazine indexer 46b functions to vertically position a magazine 30 after it has been placed on the table 63 by the operation of the vertical and horizontal translators 26, 28, respectively. A conventional sensor 71 of a type known in the art is provided for detecting whether the magazine 30 (shown in phantom) is present on table 63. Opposed side rails 87 have pins (not shown) that slide in slots 89. The side rails 87 are adjusted to the width of the magazine 30 and are releasably locked in place by screws or other fasteners (not shown). Opposed end stops 91 are slidable along the lateral edges of the table 63, so that they can be adjusted to the length of the magazine 30. The end stops 91 are also releasably locked in place by screws or other fasteners (not shown). Thus, the side rails 87 and end stops 91 prevent the carriage 30 from sliding off of the table 63. The horizontal screw 39, vertical screw 41 and lift screw 49 and their associated nuts of the magazine handler 17 may be conventional lead screws, such as manufactured by Tolomatic, Inc. (Hamel, Minn.). As is appreciated, other mechanisms may be used without departing from the spirit and scope of the present invention.

Figure 3:
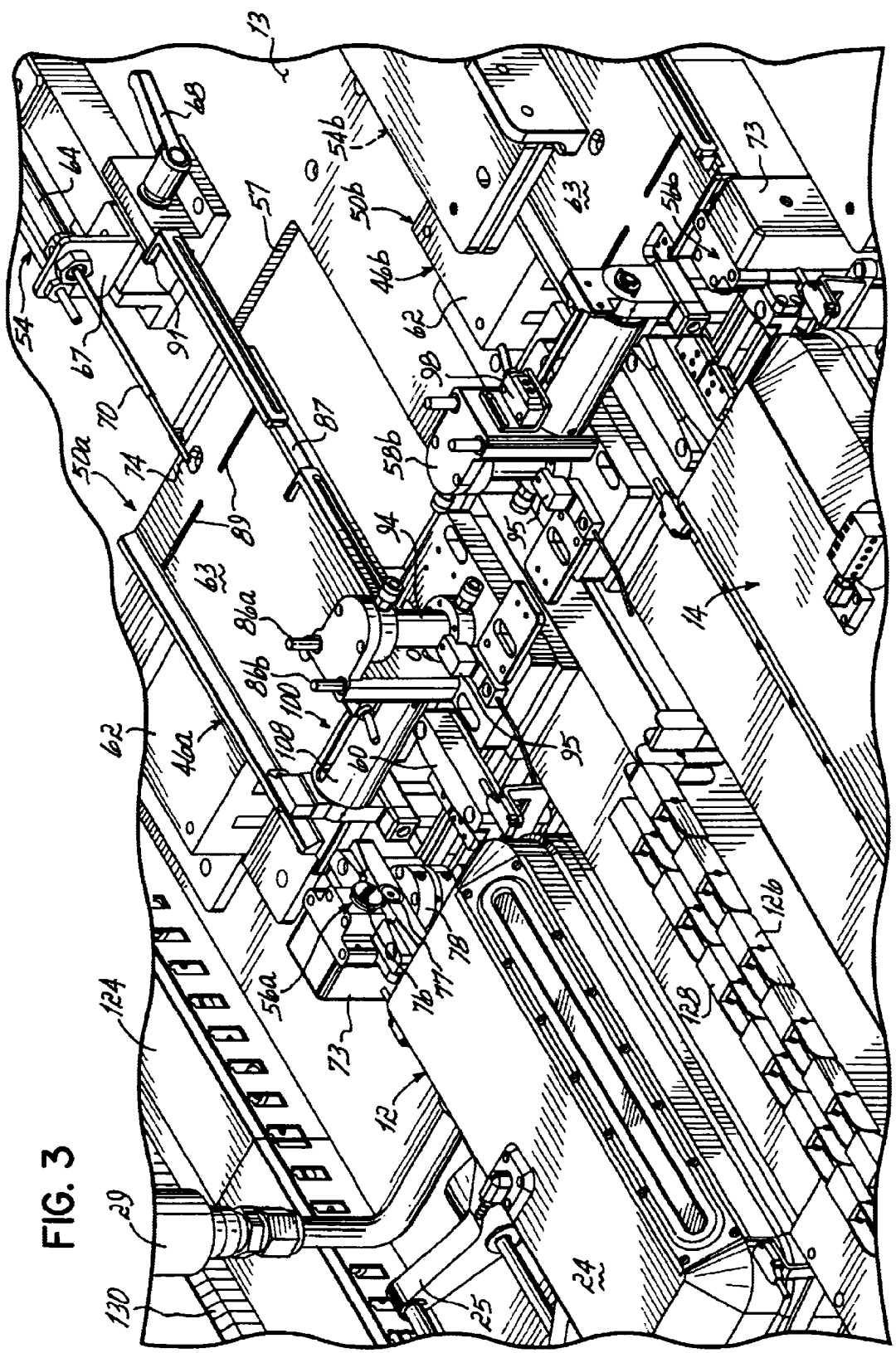
FIG. 3 is an enlarged view of a portion of the plasma treatment system of FIG. 2.

Workpiece handlers 50a, 50b of the material handling system 16 are attached to top surface 13. Workpiece handlers 50a and 50b are associated with plasma treatment chamber 12 and 14, respectively. Referring to FIG. 3, workpiece handler 50a includes a kicker 54a, a pinch wheel assembly 56a, and a workpiece translator 58a. Since the workpiece handlers 50a, 50b are substantially identical in construction and operation; only the structure and operation of workpiece handler 50a will be shown and described in detail hereinafter.

Figure 5:
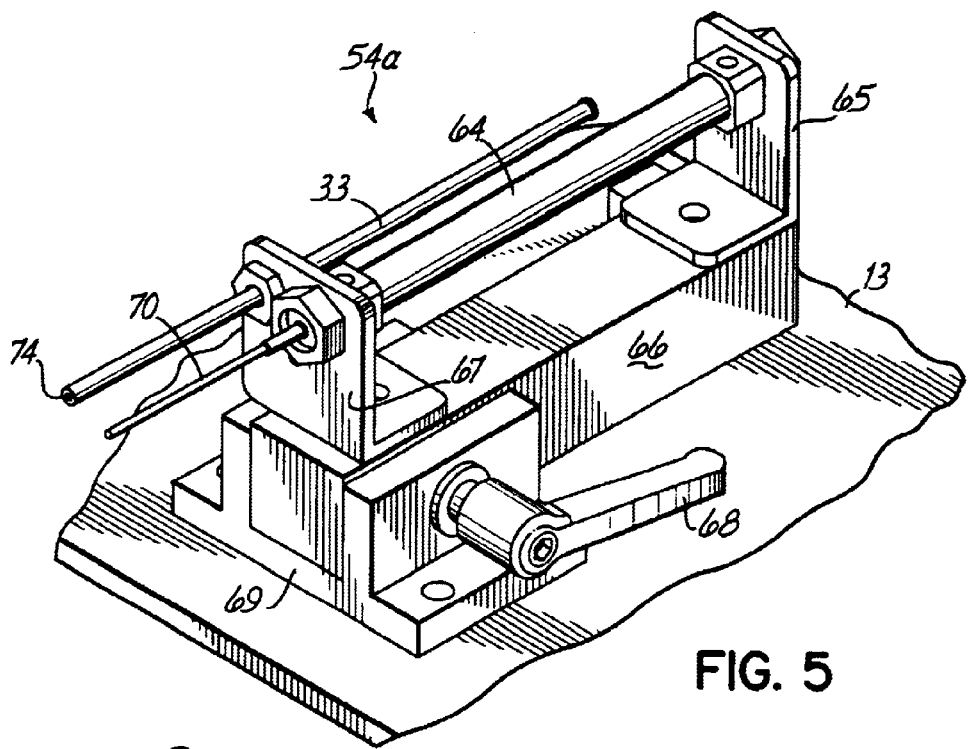
FIG. 5 is an enlarged perspective view of the workpiece kicker assembly of the plasma treatment system of FIG. 2.

Referring to FIGS. 1 and 5, kicker 54a includes a kicker actuator 64, for example, a pneumatic kicker cylinder, attached at opposed ends by angle brackets 65, 67 to a support block 66 carried by a slider bearing 69. A lever 68 operates a mechanism that unlocks support block 66 to slide within bearing 69 for positioning relative to a magazine 30 of a given length. Kicker cylinder 64 is actuated by a four-way solenoid valve (not shown). An end effector 70 is removably attached at its proximal end to a distal end of a threaded cylinder rod 72 of kicker cylinder 64. The length of end effector 70 depends upon the length of the magazine 30. A fiber-optic sensor 74 is provided in a bore in a protruding distal end of an adjustable rod 33. Sensor 74 is operable to detect the presence or absence of a workpiece 18 in a specific slot 19 of the magazine 30 which has been positioned vertically by magazine indexer 46a to be aligned with the end effector 70.

Figure 6:
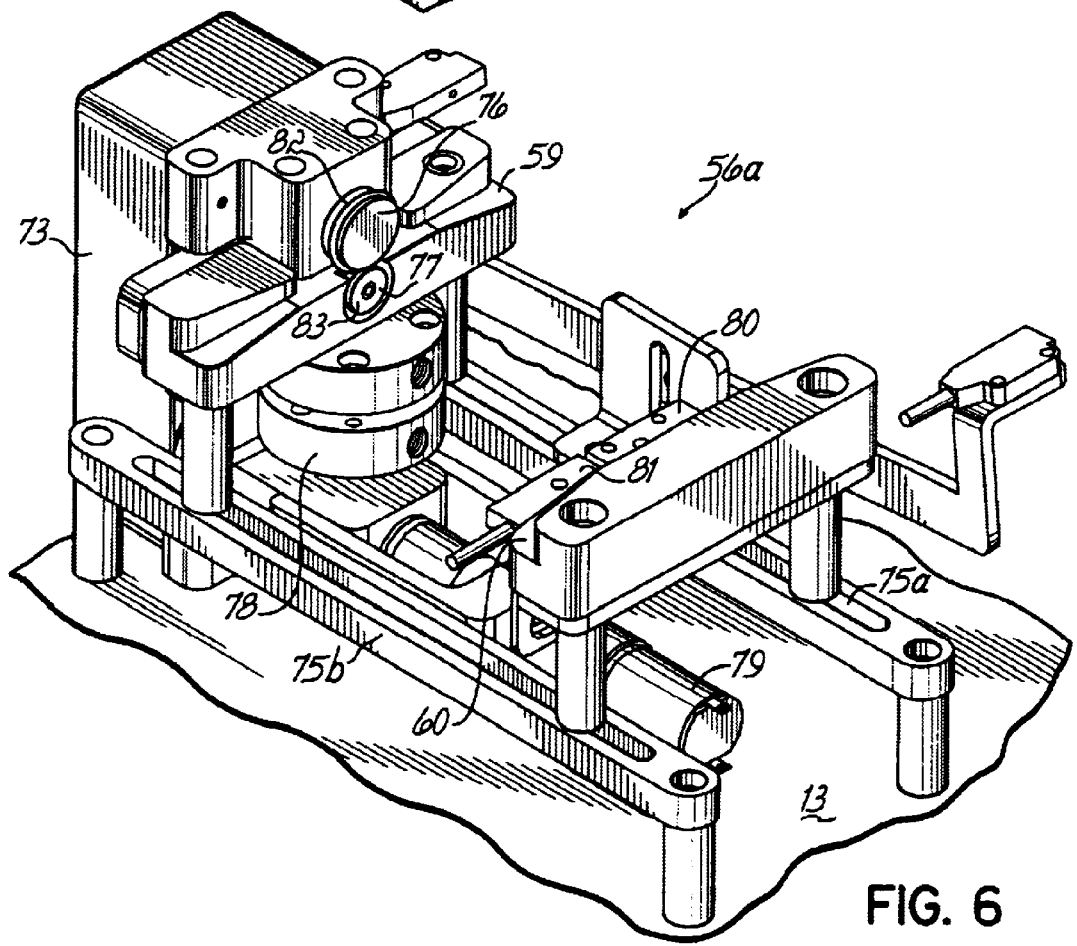
FIG. 6 is a perspective view of the pinch wheel assembly of FIG. 2.

Referring to FIG. 6, pinch wheel assembly 56a of workpiece handler 50a includes a drive wheel 76, an idler wheel 77, and a pinching actuator 78, for example, a pneumatic pinching cylinder. Bidirectional motor 79 provides a bidirectional rotational drive to drive wheel 76 via a drive mechanism 73, for example, a pulley drive or a gear box. Drive wheel 76 is normally positioned above idler wheel 77 such that a workpiece 18 may be moved therebetween. When a workpiece is present, pinching cylinder 78 is operated to move drive wheel 76 downward toward the idler wheel 77, thereby applying a downward force against an upper surface of the workpiece 18 and pinching workpiece 18 between the drive and idler wheels 76, 77. Motor 79 is then turned on to rotate the drive wheel 76 and move the workpiece in a desired direction. Drive and idler wheels 76, 77 include respective O-rings 82, 83 that provide a frictional contact with opposed surfaces of the workpiece 18. Photosensors 80, 81 on opposed sides of wheels 76, 77 detect the presence or absence of an edge of the workpiece 18. Idler wheel 77 is attached to a rail 59, which along with rail 60, support and guide the workpiece 18 when engaged by assembly 56a. Rails 59, 60 are substantially coplanar and substantially collinear with corresponding rails of the powered electrode (not shown) inside plasma treatment chamber 12. Further, rails 59, 60 are slideably attached to a pair of slotted supports 75a, 75b for adjusting the separation distance between rails 59, 60 to accommodate workpieces of varying width.

Figure 7:
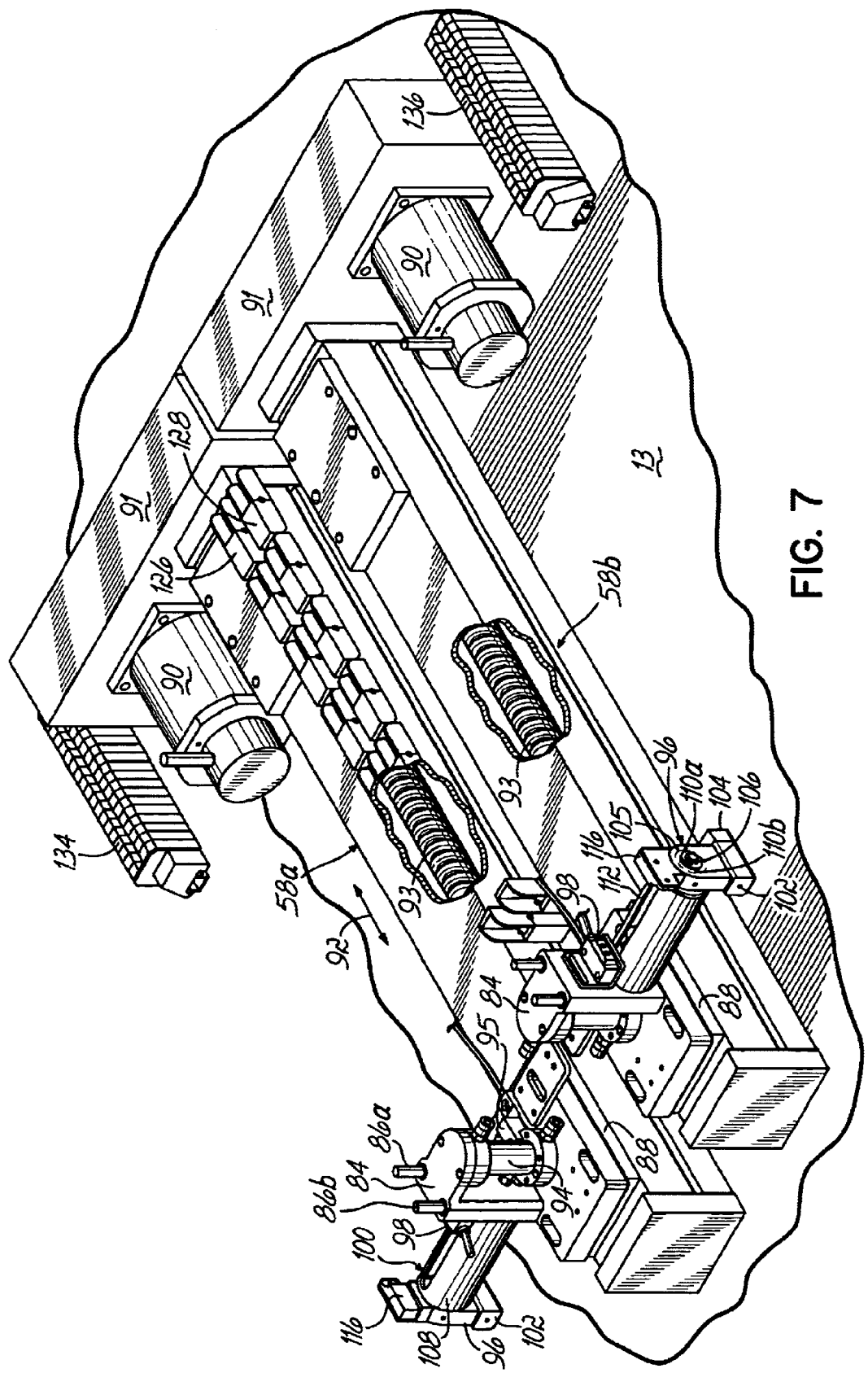
FIG. 7 is a perspective view of the horizontal workpiece actuator of FIG. 2.
Figure 7A:
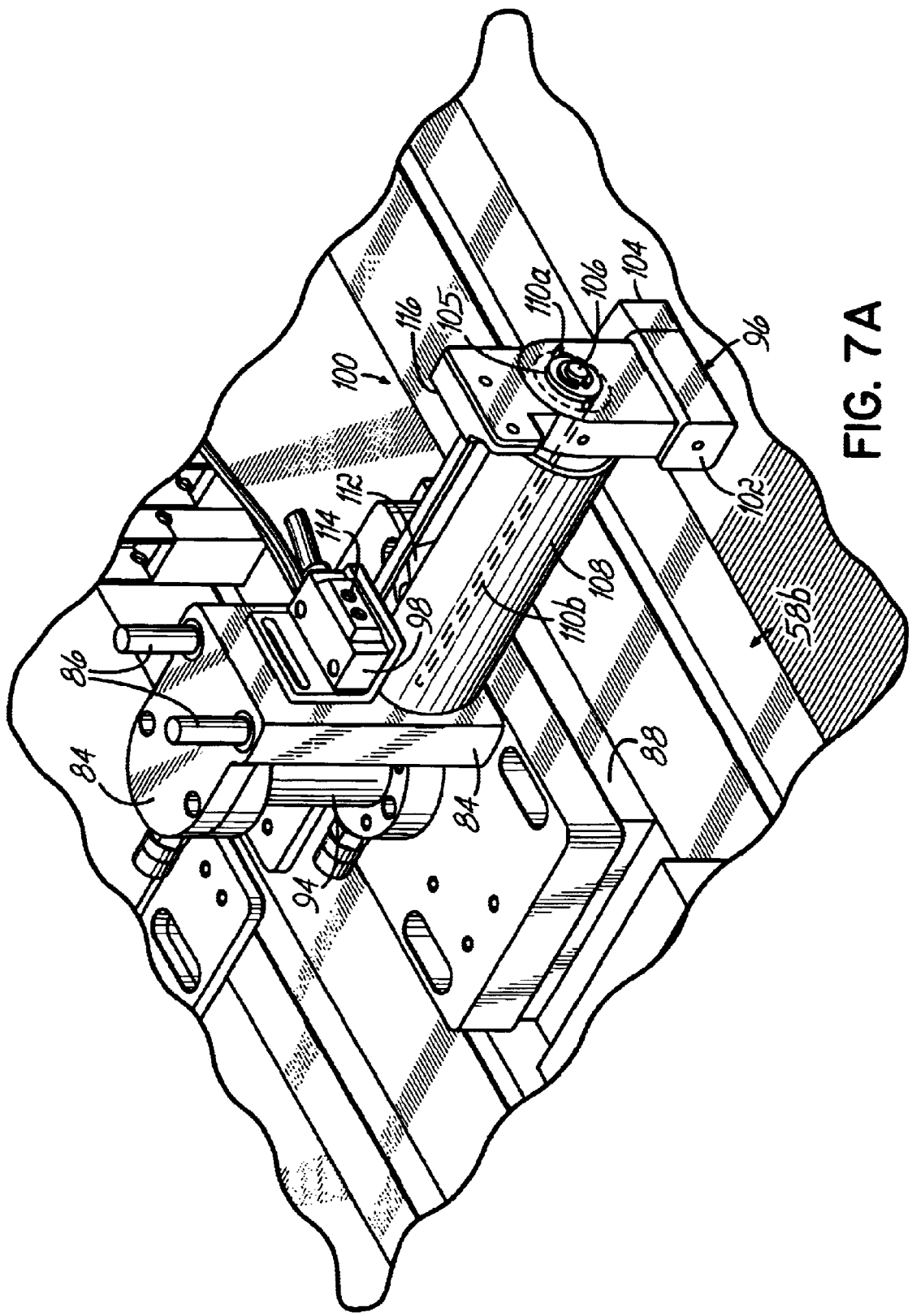
FIG. 7A is an enlarged perspective view of the horizontal workpiece actuator of FIG. 7.

Referring to FIGS. 7 and 7A, workpiece translator 58a of workpiece handler 50a is operable for transferring the workpiece 18 between pinch wheel assembly 56a and the plasma treatment chamber 12. The workpiece translator 58a has an actuator 90, for example, a bidirectional electric motor, that is operably connected, for example, by a belt drive mechanism, to a screw 93 (FIG. 7) rotatably mounted at its ends above the surface 13. A nut (not shown) of the screw 93 is connected to a carriage 88. Operation of the motor 90 moves or translates the carriage 88 in a horizontal direction 92 between a first position (FIG. 7) adjacent one end of one of the plasma chambers (FIGS. 1 and 2) and a second position adjacent an opposite end of the plasma chamber. As is appreciated, other mechanisms may be used to move carriage 88 without departing from the spirit and scope of the present invention.

The workpiece translator 58a further includes a pusher body 84 slideably mounted for vertical motion on two vertical shafts 86a, 86b that are connected at their lower ends to the carriage 88. The pusher body 84 is connected to a movable element of a pusher actuator 94, for example, a rod (not shown) of a pneumatic pusher cylinder. Pusher body 84 carries a pusher arm 96, a proximity sensor 95 (FIG. 7), a workpiece jam sensor 98, and a torsional workpiece jam-relief mechanism 100. Flat surfaces 102, 104 of pusher arm 96 are designed to contact respective leading and trailing edges of workpiece 18. The pusher cylinder 94 has a stroke sufficient to translate the surfaces 102, 104 downward into alignment with the edges of workpiece 18 and upward such that a workpiece 18 can be translated beneath the surfaces 102, 104.

Pusher arm 96 is pivotably attached to the pusher body 84 by a bearing 105 carried on a shaft 106, which is housed within an outer enclosure 108. Pusher arm 96 can pivot either clockwise or counterclockwise about shaft 106, depending upon the direction of motion of carriage 88. Two spring steel wires 110a, b are provided within enclosure 108 and are oriented coplanar with shaft 106. Opposed ends of wires 110a, b are attached to pusher arm 96 and pusher body 84, respectively. Wires 110a, 110b are slideably positioned in holes provided in a torsion adjuster 112. Torsion adjuster 112 is operable for regulating the torsional tension that must be applied to one of the flat surfaces 102, 104 to pivot pusher arm 96 about shaft 106. The jam sensor 98 has a photoelectric sensor 114 and a matching reflector 116 for detecting a change in the angular orientation or deflection of pusher arm 96. Proximity sensor 95 detects the presence or absence of the pusher body 84 to verify the positioning of the pusher body 84 and whether or not pusher cylinder 94 has actuated.

Referring to FIGS. 1 and 2, plasma treatment system 10 includes cable trays, such as cable trays 120, 122, 124, 126 and 128 for routing electrical cables across surface 13 and terminal blocks, such as terminal blocks 130, 132, 134, and 136 for making ordered electrical and signal connections. Plasma treatment system 10 also includes a light curtain 138a, 138b that uses confronting photoelectric sensors to detect an object, such as a magazine 30, entering and exiting an access opening (not shown) in the enclosure (shown in phantom in FIG. 2 and indicated generally by reference numeral 137). An exhaust conduit 140 is provided for ventilating vapors exhausted by the vacuum pumps (not shown) that evacuate chambers 12, 14. It will be understood by those of ordinary skill in the art that the location and configuration of one or all of the cable trays, terminal blocks, light curtain, and exhaust conduit may be altered without departing from the spirit and scope of the present invention.

Figure 8:
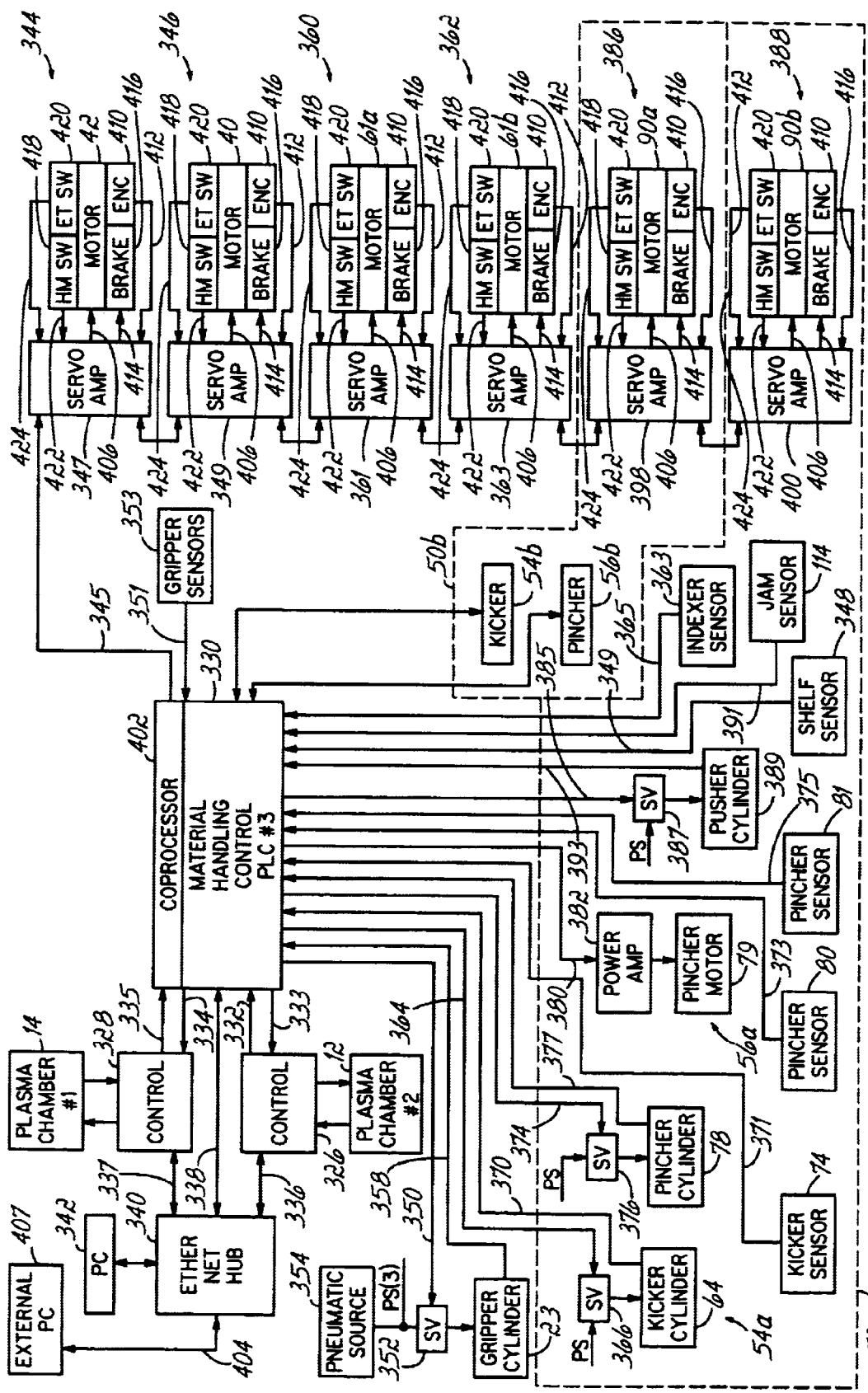
FIG. 8 is a schematic block diagram of a control system for operating the plasma treatment system.

Referring to FIG. 8, the plasma treatment system 10 illustrated in FIGS. 1 and 2 includes first and second plasma treatment chambers 12, 14, respectively. The operation of chambers 12,14 is independently controlled by respective controllers 326, 328. The material handling operation required to provide strips or workpieces to and from the chambers 12, 14 is controlled by a control 330. The control 330 has digital input/output ("I/O") communication lines 332, 333 connected to the plasma chamber controller 326. Similar digital I/O lines 334, 335 are connected to the second plasma chamber controller 328. All three controllers 326, 328, 330 are connected via respective communication lines 336, 337, 338 to an Ethernet hub 340 that, in turn, is connected to a PC 342 that functions as a user interface with the three controllers, 326, 328, 330. A graphical user interface is connected to the PC 342 in a known manner.

The magazine handler 17 of FIGS. 1 and 2 has vertical and horizontal magazine translators 26, 28, respectively. The magazine translators 26, 28 include respective vertical and horizontal magazine drives 344, 346. The control 330 provides desired position, velocity and acceleration command signals over a communication link 345 to servoamplifiers 347, 349 associated with the respective magazine drives 344, 346. The servoamplifiers 347, 349 operate to command the operation of respective motors 42, 40 to move the gripper 20 to the positions commanded by the control 330. When the commanded positions are achieved, the servoamplifiers 347, 349 provide respective in-position signals back to the control 330 over the communication link 345.

Normally another material handling system external to the plasma processing system 10 will place a magazine on a shelf, for example, shelf 32. A shelf sensor 348 provides a feedback signal over input 349 of the material handling control 330 in response to the shelf sensor 348 detecting the presence of a magazine on the shelf. After the magazine handler drive systems 344, 346 have moved the gripper 20 to a desired position, for example, proximate a magazine on the upper shelf 32, the material handling controller 330 provides a signal on an output 350 to operate a 4-way solenoid valve 352. Operating the solenoid valve 352 directs or ports pressurized air from a pneumatic source 354 to a gripper cylinder 23. Depending on the position of the solenoid valve 352, pressurized air functions to either extend or retract the gripper cylinder 23. Sensors (not shown) on the gripper cylinder 23 provide feedback signals over lines 358 to the material handling control 330 in response to the gripper cylinder 23 achieving being at the ends of its stroke. Thus, the operation of the gripper cylinder 23 is verified to the material handling control 330. The material handling control 330 then operates the magazine translators 26, 28 to move the magazine to an appropriate magazine indexer 46a, 46b. Indexer sensor 367 provides a feedback signal on input 365 of the controller 330 upon detecting the presence of a magazine.

The magazine handler 17 also has first and second magazine indexers 46a, 46b (FIGS. 1 and 2) associated with the respective plasma chambers 12. 14. The magazine indexer 46a has a magazine indexer drive 360 that includes a servoamplifier 361 and a motor 61a. Command signals representing a desired vertical position of a magazine are provided by the material handling control 330 over communication link 345 to the servoamplifier 361. The servoamplifier controls the operation of the motor 61a so that the magazine is moved to the desired vertical position, and thereafter, an in-position signal is provided back to the control 330. When at a desired vertical position, a strip or workpiece in the magazine is aligned with a workpiece handler 50a associated with plasma chamber 12, thereby permitting removal and reinsertion of the workpiece. The magazine indexer 46b is similar in construction to magazine handler 46a and includes a magazine indexer drive 362 having a motor 61b for moving a magazine vertically into alignment with a workpiece handler 50b associated with plasma chamber 14.

Each of the plasma treatment chambers 12, 14 has an independently operating workpiece handlers 50a, 50b, respectively. The workpiece handlers 50a and 50b operate to remove workpieces from respective magazines, move the workpieces into a respective plasma treatment chamber 12, 14 and then remove the workpiece from the respective chamber 12, 14 and reinsert it back into the magazine. The workpiece handlers 50a, 50b are substantially identical in construction and operation; and therefore, only the structure and operation of workpiece handler 50a will be shown and described in detail. After the magazine is properly positioned by the vertical indexer 46a, the control 330 provides a command signal on output 364 to operate solenoid valve 366 and port pressurized air to the kicker cylinder 64 of a kicker 54a which pushes the workpiece to be processed partially out of the magazine. The operation of the kicker cylinder 64 is verified by sensors (not shown) that provide feedback signals on inputs 370 of the material handling control 330 in response to the kicker cylinder 64 achieving its extended and retracted positions.

The operation of the kicker 54a pushes the workpiece into a pincher 56a. A pinching force is provided on the workpiece by pincher cylinder 78 in response to the material handling control 330 providing a command signal over output 374 to the solenoid valve 376. Sensors (not shown) are provided with the pincher cylinder 78 to provide feedback signals on an input 377 of the controller 330 indicating that the pincher cylinder 78 has achieved its extended and retracted positions. The workpiece is moved through the pincher 56a by the material handling control 330 providing signals over output 380 to a power amplifier 382 that operates the pincher motor 79 in the desired direction. The pincher 56a functions to fully remove a workpiece from a magazine, so that it may be moved into an appropriate plasma treatment chamber, for example, chamber 12.

Moving the workpiece into a chamber is accomplished by another portion of the workpiece handler 50a, a workpiece translator 58a. The workpiece translator 58a includes a workpiece translator drive 386 which translates a workpiece into and out of plasma treatment chamber 12. A similarly constructed and operating workpiece translator 58b has a workpiece translator drive 388 and functions to translate a workpiece into and out of plasma treatment chamber 14.

The drive systems 344, 346, 360, 362, 386, 388 have respective servoamplifiers 347, 349, 361, 363, 398, 400, which are connected together in a daisy chain link and are further connected to a high-speed co-processor 402 within the material handling control 330. The co-processor 402 is connected to the, servoamplifiers 390–400 by means of an RS-485 multidrop network 345. The material handling control 330 provides position, velocity and acceleration command signals via the co-processor 402 and network 345 to a servoamplifier, for example, servoamplifier 347. The servoamplifier 347 then provides, over output 406, command signals to the motor 42, for example, a DC servo motor. An encoder 410 is mechanically coupled to the motor 42 and provides a feedback signal over input 412 to the servoamplifier 347. The servoamplifier 347 also provides command signals over an output 414 to operate a brake 416 as required Further, a home position limit switch 418 and an end of travel limit switch 420 provide feedback signals over respective inputs 422 and 424 of the servoamplifier 347. Thus, the servoamplifier 347 provides full, closed loop control over the operation of the motor 42. When the motor 42 has achieved the position commanded by the material handling control 330, the servoamplifier 347 provides an in-position signal over the network 345 to the material handling control 330. As may be observed from FIG. 8, the detailed structure of the drive systems 346, 360; 362, 386, 388 are identical to the drive system 344 just described.

Figure 9A:
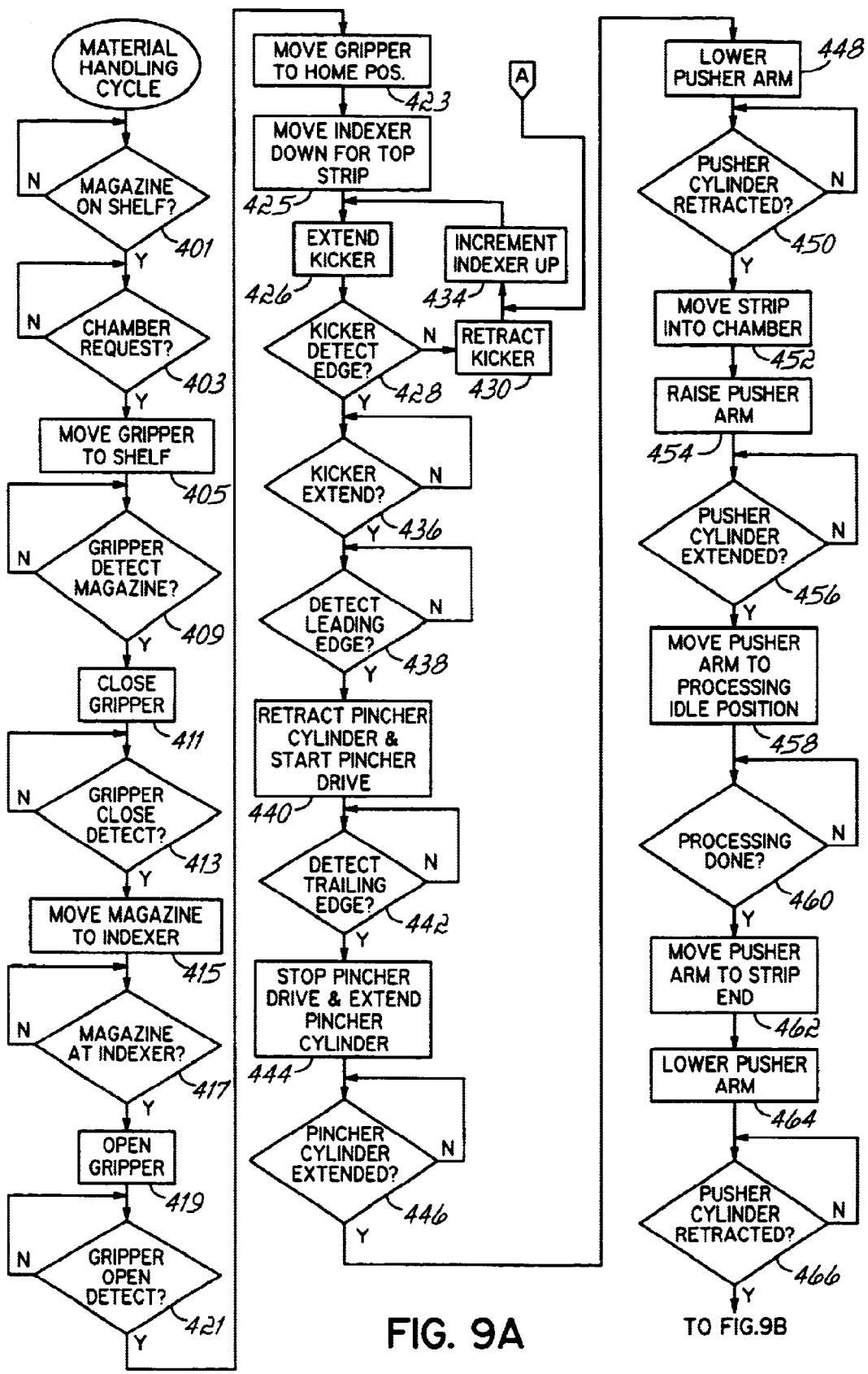
FIGS. 9A and 9B are a flow chart illustrating a process of a material handling cycle of the plasma treatment system of FIG. 1.
Figure 9B:
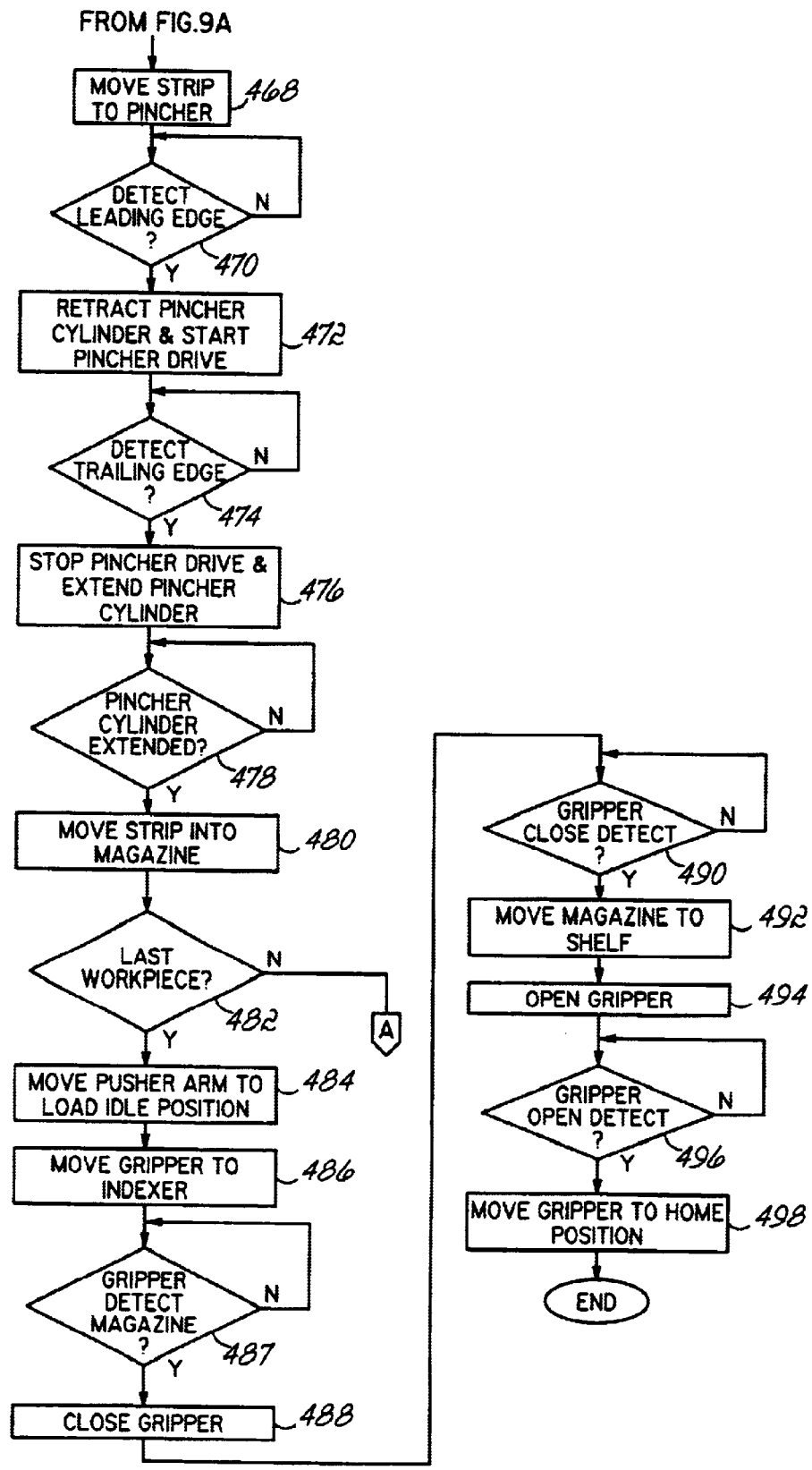

FIGS. 9A and 9B are a flowchart illustrating the operation of a material handling cycle implemented by the control 330 of FIG. 8. Prior to initiating a material handling cycle, a magazine 30 containing workpieces 18 must be placed on one of the shelves, 32, 34. A magazine 30 may be manually placed on one of the shelves and positioned against the locating blocks 35. Further, the user would then utilize the PC 342 having a graphics user interface to program the parameters necessary for the plasma treatment system 10 to handle the magazine 30 and treat the workpieces 18 within the magazine 30. Such parameters include an identification of the magazine 30, its size, the number of workpieces contained therein, and the pitch or separation between magazine slots or the workpieces 18, etc. In addition, information must be input by the user relating to the workpiece 18, for example, its physical size, the recipe defining the parameters of the plasma treatment process to be executed within the chamber, etc. That information is transferred from the interface PC 342 through the Ethernet hub 340 and to the appropriate ones of the controls 326, 328, 330. Alternatively, a magazine may be placed on one of the shelves 32, 34 by a material handling device that is operating external to the plasma treatment system 10. Simultaneously with the placement of a magazine on one of the shelves by an external device, processing information relating to that magazine and the workpieces therein is transferred via a communication link 404 from an external computer 407 through the Ethernet hub 340 and to the appropriate ones of the controls 326, 328, 330.

Upon a magazine 30 being placed on a shelf, for example, the upper shelf 32, a sensor 348 detects the presence of the magazine 30 and provide a magazine present feedback signal on the input 349 to the material handling control 330. After determining the presence of the magazine 30 at 401, the control 330, at 403, determines whether a chamber, for example, chamber 12, is requesting a magazine. Therefore, if control 330 receives a digital I/O signal from one of the controls 326, 328 indicating that a respective plasma chamber 12, 14 is ready to process workpieces, the material handling process begins.

The control 330, at 405, provides command signals to move the gripper 20 to the shelf associated with the chamber requesting the magazine. In this embodiment, magazines placed on the upper shelf 32 are moved to and from the plasma treatment chamber 12, and magazines placed on the lower shelf 34 are moved to and from the plasma treatment chamber 14. The following example of a material handling cycle is described with respect to the plasma treatment chamber 12. Assume that the gripper 20 is located at its home position, that is, the uppermost position of the vertical magazine translator 26 and the leftmost position as viewed in FIG. 1 of the horizontal magazine translator 28. The control 330 first provides command signals to the servoamplifier 347 representing a motion of the gripper 20 vertically downward to an elevation at which the gripper 20 can access the magazine 30 on the shelf 32. The servoamplifier 347 provides the necessary closed loop control to operate the motor 42 and move the gripper 20 to the desired position. When at that position, the servoamplifier 347 provides an in-position signal over the network 345 to the control 330 via the co-processor 402. Upon detecting that in-position signal, the control 330 then provides command signals to the servoamplifier 349 representing horizontal motion of the gripper 20 over the shelf 32 to a position at which the magazine 30 can be picked up.

The control 330 then at 409 looks for feedback signals on input 351 (FIG. 8) from gripper proximity sensors 353 on the gripper jaws 21, 22. If the gripper sensors 353 detect the presence of the magazine 30, the control 330, at 411, provides a command signal on the output 350 to operate the 4-way solenoid valve 352. Operation of the valve 352 causes pressurized air to be ported from the pneumatic source 354 to the cylinder 23 in a direction complementing the force of a cylinder spring, thereby causing the gripper jaws 21, 22 to move together and close against the magazine 30. The gripper cylinder has known sensors (not shown) that provide feedback signals on an input 358 of the control 330 in response to the extended and retracted positions of the gripper cylinder 23. If the gripper jaws 21, 22 are closed against the magazine 30, the cylinder 23 is not at either of its extended or retracted positions; and the control 330, at 413, detects no feedback signal on input 358. Thus, the control 330 can conclude that the gripper jaws 21, 22 are grasping the magazine 30.

After the magazine has been grasped by the gripper 20, the control 330 then at 415 provides command signals to the servoamplifier 349 to move the magazine over the magazine indexer 46a. The servoamplifier 349 provides the necessary command signals to the motor 40 to move the gripper 20 and magazine 30 to the desired position and thereafter, provides an in-position signal back to the control 330. The control 330 then provides command signals to the servoamplifier 347 causing the gripper 20 and magazine 30 to be moved vertically downward and placed on a receiving plate 63 of the magazine indexer 46a associated with the plasma chamber 12. When the magazine 30 has been moved to that position, the servoamplifier 347 provides an in-position signal back to the material handling control 330. In addition, indexer sensor 367 provides a feedback signal over the input 365 to the control 330 indicating the presence of the magazine.

Upon detecting the presence of the magazine, at 417, the control 330, at 419, provides command signals over the output 350 to operate the solenoid valve 352, so that fluid is ported through the cylinder 23 in a direction opposing the force of the internal spring and causing the gripper jaws 21, 22 move to their fully opened position. A sensor (not shown) in the cylinder 23 provides a feedback signal over the input 358. Upon detecting that feedback signal indicating the gripper is opened, at 421, the control 330 then, at 423, moves the gripper 20 to its vertical home position, that is, its uppermost vertical position. Thus, the control 330 provides command signals to the servoamplifier 347; and the servoamplifier 347 operates the motor 42 in a direction moving the gripper 22 to move to its home position. It should be noted that in moving any of the motors 40, 42, 61a, 61b, 90a, 90b to their home positions, the motor is first moved toward the home limit switch 418. The servoamplifier then stops the motor in response to the home limit switch 418 switching state. Next the motor is moved slowly in an opposite direction until the servoamplifier detects an index pulse from the encoder 410. The index pulse is provided once every revolution of the encoder. Therefore, moving a motor to the home position locates the motor at a very accurate known position; and positioning moves from the home position and be executed with a high degree of accuracy and repeatability.

After receiving the in-position signal from the servoamplifier 347 indicating the gripper 20 has been raised, the control 330 then, at 425, provides command signals to the servoamplifier 361 to move the magazine indexer 346 vertically downward such that the uppermost of the workpieces in the magazine 30 is located at a position to facilitate its removal from the magazine. The servoamplifier 361 provides command signals to operate the motor 61a in a direction to lower the magazine 30 to the desired position. When that position is achieved, the servoamplifier 361 provides an in-position signal back to the control 330.

Upon receiving an in-position signal from the servoamplifier 361 indicating the indexer is lowered to the proper position, the control 330 at 426 generates a command signal over the output 364 to operate the kicker 54a. The command signal is provided to a 4-way solenoid valve 366. The solenoid valve 366 is operated to extend the kicker cylinder 64. As the kicker cylinder 64 extends, the kicker sensor 74 which is located in the distal end of the rod 33 provides a feedback signal on input 371 of the control 330. The state of that feedback signal is determined by the presence of a workpiece 18 in the uppermost slot of the magazine 30. If the feedback signal has a state indicating that a workpiece 18 is not present, that state is detected, at 428, by the control 330 which then, at 430, retracts the kicker 54a. To retract the kicker 54a, the control 330 provides command signals over the output 364 to switch the state of the solenoid valve 366, thereby retracting the kicker cylinder 64. The kicker cylinder 64 provides a retracted feedback signal on the input 370 of the control 330 when the cylinder 64 reaches its fully retracted position. Upon the control 330 detecting that retracted position, it provides, at 434, command signals to the servoamplifier 361 to increment the magazine indexer up by the pitch, that is, the distance between, the workpieces 18 in the magazine 30. When the control 330 receives an in-position signal from the servoamplifier 361 indicating that the magazine has been incremented up, the control 330 again provides command signals over the output 364 to operate the solenoid valve 366 and extend the kicker cylinder 64. Assume that is slot of the magazine 30 has a workpiece 18, the control 330 detects, at 428, an edge of the workpiece; and the kicker cylinder 64 continues to move the end effector 63 outward. The end effector 63 then contacts the edge of the workpiece, and further extension of the kicker cylinder 64 and end effector 63 pushes the workpiece 18 out of the magazine 30 and toward the pincher 56a. When the kicker cylinder 64 is fully extended, a fully extended feedback signal is provided on the input 370 to the control 330 which is detected at 436.

As the workpiece 18 is pushed from the magazine 30 by the kicker cylinder 64, the leading edge of the workpiece 18 is picked up by rails 59, 60 within the pincher 56a. As the leading edge of the workpiece moves over the rails 59, 60, the leading edge passes over a first sensor 81 that provides a feedback signal on input 375 to the control 330. The leading edge of the workpiece then passes between a drive wheel 76 and an idler wheel 77 and thereafter, over sensor 80 that provides a feedback signal on input 373 to the control 330. Upon detecting motion of the leading edge first over sensor 81 and then over the sensor 80, the control 330 knows that the workpiece is moving from the magazine 30 toward the chamber 12.

After the control 330, at 438, detects the leading edge passing over the sensor 80, the control, at 440, provides command signals over the output 374 to the 4-way solenoid valve 376. The solenoid valve 376 is operated to retract the pincher cylinder 78, thereby pulling the drive wheel 76 firmly against the workpiece and the idler wheel 77. The pincher cylinder 78 also provides feedback signals on the input 377 indicating that the pincher cylinder 78 is either at its extended or its retracted position. With the workpiece 18 between the drive wheel 76 and idler wheel 77, if after a period of time after operating the pincher cylinder 78, the control 330 does not detect any feedback signal on the input 377, the control can determines that the workpiece 18 is between the drive wheel 76 and the idler wheel 77. The control 330 then, at 440, provides command signals on the output 380 to the power amplifier 382 to turn on the pincher motor 79. Knowing that the workpiece 18 is moving from the magazine 30 toward the chamber 12, the command signal over the output 380 operates the pincher motor 79 such that rotation of the drive wheel 76 moves the workpiece 18 in the same direction. As viewed in FIG. 2, rotation of the drive wheel in the clockwise direction functions to move the workpiece 18 from the magazine 30 toward the chamber 12.

The pincher motor 79 continues to rotate until the trailing edge of the workpiece passes over the sensor 81. Upon the control 330, at 442, detecting the trailing edge of the workpiece 18, the control 330, then at 444, provides command signal over the output 380 to the power amp 382 to stop operation of the pincher motor 79. In addition, the control 330 provides a command signal over output 374 to operate the solenoid valve 376 such that the pincher cylinder 78 is extended. Extending the pincher cylinder 78 unclamps the workpiece from between the drive wheel 76 and the idler wheel 77.

Upon the control 330 detecting, at 446, an extended feedback signal on the input 377 from the pincher cylinder 38, the control 330, at 448, lowers the pusher arm 96. The pusher arm is located at its load idle position, that is, immediately above the pincher assembly 56*a*. The pusher arm 96 is lowered by the control providing command signals on output 385 to pusher solenoid valve 387 and operating the solenoid valve 387 to retract the pusher cylinder 94. The control then, at 450, detects a retracted feedback signal on input 393 from the pusher cylinder 94 indicating that the pusher arm 96 is in its lowered position. Thereafter, at 452, the control 330 proceeds to move the workpiece into the chamber 12. This motion is accomplished by the control 330 providing output signals to the servoamplifier 400 representing a motion of the workpiece 18 into the chamber such that the workpiece 18 is centered within the chamber 12. The servoamplifier 400 provides command signals to the motor 90*a* to operate the motor 90*a* such that surface 102 of the pusher arm 96 moves into contact with the trailing edge of the workpiece 18 and pushes the workpiece 18 over the rails 59, 60 and into the chamber 12. When the servoamplifier 400 detects that the motor has moved to the commanded position, the operation of the motor 90*a* is terminated: and an in-position signal is provided to the material handling control 330. The control 330, then at provides command signals on output 385 to the solenoid valve 387 causing the pusher cylinder 94 to extend, thereby raising the pusher arm 96 above the workpiece 18. Upon detecting, at 456, an extended feedback signal on input 393 from pusher cylinder 94, the control then proceeds, at 458, to move the pusher arm 96 to a processing idle position. That motion is accomplished by the control 330 providing command signals to the servoamplifier 400 causing the servoamplifier to operate the motor 90*a* and translate the pusher arm 96 to the processing idle position, that is, a position at an end of the chamber 12 adjacent the motor 90*a*. When at the processing idle position, the servoamplifier 400 provides an in-position signal to the material handling control 330.

At this point, the workpiece is loaded into the plasma chamber 12, and the pusher arm 96 is located at a position of non-interference with the operation of the lid of the plasma chamber 12. The control 330 provides digital I/O signals to the control 326 for the chamber 12 indicating that a workpiece 18 has been loaded into the chamber 12 and that the lid of the plasma chamber 12 may be closed. A plasma treatment operation is conducted within the plasma chamber 12 in accordance with a process described in the earlier referenced P.C.T. Application Serial No. US00/18797. When that plasma treatment process is finished and the lid of the chamber 12 has been raised, the control 326 provides digital I/O signals to the material handling control 330 indicating that the process is finished and the workpiece can be removed. The control 330, at 460, detects the end of the process and proceeds, at 462, to move the pusher arm 96 to a location such that its surface 104 is immediately adjacent an end of the workpiece 18. That motion is accomplished by the control 330 providing command signals to the servoamplifier 400 defining the desired position of the surface 104.

When the control 330 receives an in-position signal from the servoamplifier 400, the control then, at 464, proceeds to lower the pusher arm 94. The arm is lowered by the control 330 providing command signals on output 385 to operate the solenoid valve 387 such that the pusher cylinder 94 is retracted. Upon the control 330 detecting a retracted feedback signal on input 393, at 466, indicating that the pusher arm 96 is lowered, the control 330 then, at 468, proceeds to move the workpiece 18 back toward the pincher 56*a*. Again, the control 330 provides command signals to the servoamplifier 400 to operate the motor 90*a* such that the workpiece is moved to place the leading edge of the workpiece over the sensor 81. As the workpiece is pushed from the chamber 12, the leading edge first moves over the sensor 80 which is detected by the control 330 and thereafter, the leading edge moves over the sensor 81. Upon the control 330 detecting an in-position signal from the servoamplifier 400 and the leading edge of the workpiece moving first, over first sensor 80 and thereafter, over the sensor 81, the control 330 then, at 472, operates the pincher 56*a*. The control 330 provides command signals over the output 374 to operate the solenoid valve 376 to retract the pincher cylinder 78, thereby clamping the workpiece 18 between the drive wheel 76 and the idler wheel 77. After the control 330 receives a retracted feedback signal from the pincher cylinder 78, it then provides command signals over the output 380 to the amplifier 382 which causes the pincher motor 379 to be turned on. Knowing that the leading edge of the workpiece first moved over sensor 80 and then sensor 81, the control 330 knows that the workpiece is moving from the chamber 12 toward the magazine 30. Thus, the pincher motor 79 is operated in a direction to rotate the drive wheel 76 in a counterclockwise direction; and thus, the workpiece is pulled over the rails 59, 60 from the chamber 12 and into the slot of the magazine 30 from which it was removed.

The control then, at 474, detects when the trailing edge passes over the sensor 80. At that point, the control, at 476, provides command signals over the output 380 to the power amp 382 to shut the pincher motor 79 off. Command signals are also provided over the output 374 to the solenoid valve 376 to cause the pincher cylinder to extend, thereby releasing the workpiece 18 from between the drive wheel 76 and the idler wheel 77. Upon the control 330, at 478, detecting an extended feedback signal from the pincher cylinder 78, the control 330 then proceeds, at 480, to move the workpiece 18 back into the magazine. This is accomplished by providing command signals to the servoamplifier 400 to operate the motor 90*a* such that the pusher arm 96 moves toward the trailing edge of the workpiece 18. The surface 104 of the pusher arm 96 then contacts the trailing edge of the workpiece 18 and continued operation of the motor 90*a* pushes the workpiece back into the slot of the magazine 30. When the desired position is reached, the servoamplifier 400 provides an in-position signal back to the control 330.

The control 330 then, at 482, determines whether the workpiece just processed was the last workpiece in the magazine. If not, the control proceeds back to process step 434 to increment the indexer up and present a new workpiece for treatment. The process described with respect to steps 426–480 are repeated for each workpiece 18 in the magazine 30. When all of the workpieces have been treated, as detected at 482, the control 330 then proceeds, at 484, to move the pusher arm 96 to the load idle position. The load idle position is a position at which the pusher arm 96 is raised and located horizontally above the pincher 56a. The control 330 first raises the pusher arm 96 in a manner as previously described; and upon receiving an extended feedback signal from the pusher cylinder 94, the control 330 proceeds to provide command signals to the servoamplifier 400 to operate the motor 90a such that the pusher arm 96 is moved back toward the chamber 12 to the load idle position.

Upon receiving an in-position signal from the servoamplifier 400, the control 330 then proceeds to move the gripper, at 486, to a position permitting the gripper 20 to grasp the magazine 30. Motion of the gripper 20 to that position is effected by the controller 330 operating first the horizontal magazine translator drive system 344 and thereafter, the vertical magazine translator 346. When the gripper is positioned, the control 330 can verify that position by monitoring the states of the gripper sensors. If the location of the gripper 20 is confirmed by the gripper sensors, the control 330 then, at 488, provides command signals over the output 350 causing the gripper cylinder 23 to close. The state of the gripper sensors is monitored to detect, at 490, that the gripper is clasped onto the magazine. Thereafter, the control 330 provides output signals, at 492, to move the magazine back to the shelf 32. The control 330 provides command signals to the vertical and horizontal magazine translators 344, 346, respectively, to move the gripper 20 and magazine back to the shelf 32. When the appropriate in-position signals are received from the horizontal magazine translator 346, the control 330 then, at 494, commands the gripper 20 to open. The open state of the gripper is detected, at 496, and at 498, the control 330 proceeds to move the gripper 20 to the horizontal and vertical home positions.

The plasma treatment system described herein uses multiple plasma treatment chambers on a single base, thereby providing a compact footprint that conserves manufacturing floor space and provides a substantial savings in manufacturing costs. Thus, the present invention substantially increasing the throughput capability of the utilized floor space. The use of multiple plasma treatment chambers on a single base also allows for the sharing of electric and gas utilities to the greatest extent practical.

Further, each of the plasma treatment chambers on the single base is individually and independently controllable. Therefore, by providing a fully independent control, different plasma treatment processes can be execute simultaneously; and both of the plasma treatment chambers may be used in any manner that the user deems most economical and efficient.

In addition, the material handling devices used with the plasma processing chambers substantially improve the handling the workpieces, both individually and in bulk. Such material handling devices substantially reduces the cycle time of loading and unloading workpieces from the plasma treatment chambers. Conventional material handling systems require a cycle time on the order of twelve to fifteen seconds to load a workpiece from a magazine into the plasma treatment chamber or to unload a processed workpiece from the chamber back into the magazine. The material handling system of the present invention can load or unload a workpiece from the chamber in about seven seconds. The improved cycle time provides still further substantial improvements in productivity and throughput capability of the utilized floor space. Thus, the plasma treatment system of the present invention provides more reliable, efficient and cost effective plasma treatment than was previously available.

While the present invention has been illustrated by a description of one embodiment and while this embodiment has been described in some detail, it is not the intention of the Applicant to restrict or in any way limit the scope of the appended claims to such detail. Additional advantages and modifications will readily appear to those skilled in the art. For example, in the described embodiment, various actuators have been identified as pneumatic cylinders and mechanical screw drives. As will be appreciated, those actuators may be implemented using any mechanical drive that provides the desired function. Further, in the described embodiment, the magazine handler is described as a Cartesian robot device that is mounted on the base and moves magazines from a queuing station to a magazine indexer location. However, as will be appreciated, other forms of a magazine handler may be used. In addition, the magazine handler may even be located off of the base. For example, a robot arm may be mounted adjacent the base and perform the same function. In other applications, a robot arm may be mounted for motion over the base and thus be able to transfer magazines from a location off of the base directly to and from the magazine indexer. Thus, in those applications, it is not necessary to use a queuing station on the base.

In the described application, untreated workpieces are removed from a magazine containing untreated workpieces; and the treated workpieces are loaded back into the same magazine. As will be appreciated, the untreated workpieces can be removed from a first untreated workpiece magazine; and the treated workpieces loaded into a different, second treated workpiece magazine. The second magazine can be queued at the same location on the base as the first magazine or at a different location, for example, at an opposite end of the plasma chamber from the first magazine. Further, in the described embodiment, the queuing station is a common load and unload location for the magazines; however, as will be appreciated, there may be multiple queuing stations with the untreated workpiece magazines being loaded at a first location and the treated workpiece magazines being unloaded at a second location.

Therefore, the invention in its broadest aspects is not limited to the specific details shown and described. Consequently, departures may be made from the details described herein without departing from the spirit and scope of the claims which follow.

What is claimed is:

1. A system for treating workpieces with a plasma, wherein a plurality of workpieces are carried in slots within a magazine, said system comprising:

at least one plasma treatment chamber having a processing space within the plasma treatment chamber;

a magazine indexer;

a magazine handler adapted to support a magazine, said magazine handler being operable to position the magazine on said magazine indexer and said magazine indexer being operable to position the magazine at a plurality of vertical positions corresponding to vertical positions of the slots;

a kicker having an end effector to eject a workpiece from the magazine; and a pinch wheel assembly to move the workpiece from the magazine to a first position outside the plasma treatment chamber; and a workpiece translator having
    a first surface adapted to contact a first edge of the workpiece, said workpiece translator being operable to move the workplace with said first surface from a first position to said processing space within said plasma treatment chamber, and
    a second surface adapted to contact an opposed, second edge of the workpiece, and said workpiece translator being operable to move the workpiece with said second surface from the processing space within the plasma processing chamber to the first position outside the plasma processing chamber.

2. The system of claim 1, wherein said kicker comprises an end effector and a pneumatic cylinder operably attached to said end effector, said end effector positioned to eject one of said workpieces from a slot in the magazine when actuated by the cylinder.

3. The system of claim 1, wherein said pinch wheel assembly comprises a drive wheel, a motor operably connected to said drive wheel for rotation thereof, a pneumatic cylinder operably connected to said drive wheel for applying a downward frictional force to an upper surface of the workpiece, and an idler wheel for supporting a lower surface of the workpiece.

4. A system for handling workpieces to be treated in a plasma treatment chamber, the system comprising:

a magazine handler adapted to support a magazine, said magazine handler being operable to move the magazine to a location adjacent the plasma treatment chamber; and a workpiece handler comprising
    a cylinder having an end effector contacting an edge of the workpiece and pushing the workpiece out of the magazine in response to said cylinder being operated, and
    an apparatus for transferring the workpiece into and out of said plasma treatment chamber, the apparatus having
      a first surface adapted to contact one edge of the workpiece, said workpiece handler being operable to push against the one edge of the workpiece to move the workpiece into the plasma treatment chamber, and
      a second surface adapted to contact an opposite edge of the workpiece, said workpiece handler being operable to push against the opposite edge of the workpiece to move the workpiece out of the plasma treatment chamber.

5. The system for handling workpieces of claim 4 further comprising a first sensor mounted on said first apparatus and providing a feedback signal indicating a presence and absence of a workpiece in a slot of the magazine.

6. The system for handling workpieces of claim 4 wherein said first apparatus further comprises a pincher device adapted to contact opposite sides of the workpiece and pull the workpiece out of the magazine.

7. The system for handing workpieces of claim 6 wherein said end effector of said cylinder is aligned with said pincher device such that said end effector pushes the workpiece out of the magazine into said pincher device.

8. The system for handling workpieces of claim 6 wherein said pincher device comprises:
  an idler wheel adapted to contact one side of the workpiece;
  a drive wheel mounted for motion toward and away from said idler wheel and adapted to contact an opposite side of the workpiece;
  a support block having said drive wheel rotationally mounted therein;
  a cylinder operatively connected to said support block for moving said drive wheel toward and away from said idler wheel; and
  a motor operatively connected to said drive wheel to rotate said drive wheel in a desired direction, thereby moving the workpiece through said pincher device in a desired direction.

9. The system for handling workpieces of claim 8 further comprising second sensors mounted on said pincher device for providing feedback signals indicating a presence of an edge of the workpiece.

10. The system for handling workpieces of claim 9 wherein one of said second sensors is located on one side of said idler wheel and another of said second sensors is located on an opposite side of said idler wheel, said second sensors providing feedback signals representing a direction of motion of the workpiece across said pincher device.

11. The system for handling workpieces of claim 10 wherein said feedback signals from said second sensors represent a leading edge of the workpiece moving across said pincher device.

12. The system for handling workpieces of claim 10 wherein said feedback signals from said second sensors represent a trailing edge of the workpiece moving across said pincher device.

13. The system for handling workpieces of claim 4 wherein said second apparatus comprises a workpiece translator having a pusher arm with first and second opposed sides containing the first and second surfaces, respectively.

14. The system for handling workpieces of claim 13 wherein said workpiece translator comprises an actuator for moving said pusher arm in a substantially vertical direction.

15. The system for handling workpieces of claim 13 wherein said workpiece translator comprises an actuator for moving said pusher arm in a substantially horizontal direction.

16. The system for handling workpieces of claim 13 wherein said pusher arm is resiliently connected to said workpiece translator, so that said pusher arm moves opposite its driven motion in response to the workpiece not moving when contracted by said pusher arm.

17. The system for handling workpieces of claim 4 further comprising an electronic control electrically connected to both of said first and said second apparatus.

* * * * *